July 28, 1970 KAZUO WATANABE 3,522,085

ARTICLE AND METHOD FOR MAKING RESISTORS IN CIRCUIT BOARD

Original Filed June 14, 1966 3 Sheets-Sheet 1

INVENTOR
KAZUO WATANABE

BY

Darby & Darby
ATTORNEYS

INVENTOR
KAZUO WATANABE

BY Darby & Darby
ATTORNEYS

INVENTOR
KAZUO WATANABE

BY

Darby & Darby
ATTORNEYS

United States Patent Office 3,522,085
Patented July 28, 1970

3,522,085

ARTICLE AND METHOD FOR MAKING RESISTORS IN PRINTED CIRCUIT BOARD

Kazuo Watanabe, Osaka, Japan, assignor to Sanyo Electric Co., Ltd., Moriguchi-shi, Japan, a corporation of Japan Continuation of application Ser. No. 557,474, June 14, 1966. This application July 9, 1969, Ser. No. 845,648
Claims priority, application Japan, Dec. 17, 1965, 40/77,929
Int. Cl. H05k *3/30*
U.S. Cl. 117—212 9 Claims

ABSTRACT OF THE DISCLOSURE

A printed circuit board and the method of making the same in which a metal foil is adhered to a substrate of insulating material. The foil on specified portions of the substrate is etched away to leave a roughened surface on which is deposited for a predetermined time and for a predetermined quantity, a suitable resistive material.

This application is a continuation of S.N. 557,474, filed June 14, 1966, now abandoned.

This invention relates to methods for making electric parts and wiring boards. More particularly, the present invention contemplates a method for making electric parts having resistors deposited on an electrically insulating substrate in unitary relation therewith and a novel and useful method for making a wiring board having conductors on an electrically insulating substrate bridged by resistors deposited on the substrate in unitary relation therewith.

According to one aspect of the invention, electric parts are manufactured by the steps of chemically etching away copper foil from a copper-laminated electrically insulating substrate for use for the so-called printed circuit obtained by causing a foil of electrolytic copper to adhere to a base plate of electrically insulating material, and depositing nickel by electroless plating on the electrically insulating substrate from which the copper foil has been etched away for providing, thereby, resistors on the substrate. According to another aspect of the invention, wiring boards are manufactured by the steps of chemically etching away portions of copper foil from a copper-laminated electrically insulating substrate for use for the so-called printed circuit in accordance with a predetermined circuit network pattern, and depositing nickel by electroless plating on those portions of the electrically insulating substrate from which the copper foil has been etched away for thereby providing resistors spanning between the conductor portions of the predetermined circuit network.

The primary object of the present invention is to provide novel and useful methods for making electric parts and wiring boards having desired resistors uniformly, tightly and intimately deposited on a substrate of electrically insulating material.

Another object of the present invention is to provide a convenient method for making wiring panels, by which a desired circuit network can easily be formed and resistors can uniformly, tightly and intimately be deposited on the surface of a substrate of electrically insulating material.

The above and other objects, advantages and features of the present invention will become more apparent from the following description with reference to the accompanying drawings, in which.

Before giving any detailed description with regard to a few preferred embodiments of the invention, it will be of use to give a brief description with regard to the method of making a copper-laminated electrically insulating substrate commonly employed in the so-called printed circuit technique.

In the above-described printed circuit technique, a sheet of paper or cloth is generally impregnated with a thermosetting resin such as phenol resin or epoxy resin and is then dried to prepare an electrically insulating base plate. On the other hand, a foil of electrolytic copper is made by the electrodeposition of copper on a metal cylinder. This electrolytic copper foil is bonded to the above-described base plate by use of a binder and heat is applied under pressure to cause the copper foil to intimately adhere to the base plate. Any further explanation with regard to this method will be unnecessary since such technique is already common in the art. However, what is important in connection with this method is the fact that, although the front face of the electrolytic copper foil laminated to the electrically insulating base plate has a high degree of flatness and smoothness which is substantially analogous to a mirror surface like the surface of the metal cylinder employed in the manufacture of the copper foil, the back face of the copper foil, that is, the face opposite to the face of the electrically insulating base plate is rendered extremely uniformly and finely rugged when microscopically examined due to the fact that the copper foil is made by the electrolysis process.

Therefore, after the electrolytic copper foil bonded onto the base plate of thermosetting nature under heat and pressure has been etched away in the manner as described above, the surface of the electrically insulating substrate has been rendered extremely uniformly and finely rugged when examined microscopically as is the case with the back face of the electrolytic copper foil, and takes the so-called "frosted" state when seen with the naked eye. The feature of the present invention resides in taking advantage of such surface condition of the electrically insulating substrate treated and prepared in the manner as described above and depositing nickel by means of electroless plating on such surface in a manner as will be described in detail hereunder.

Figure 1:
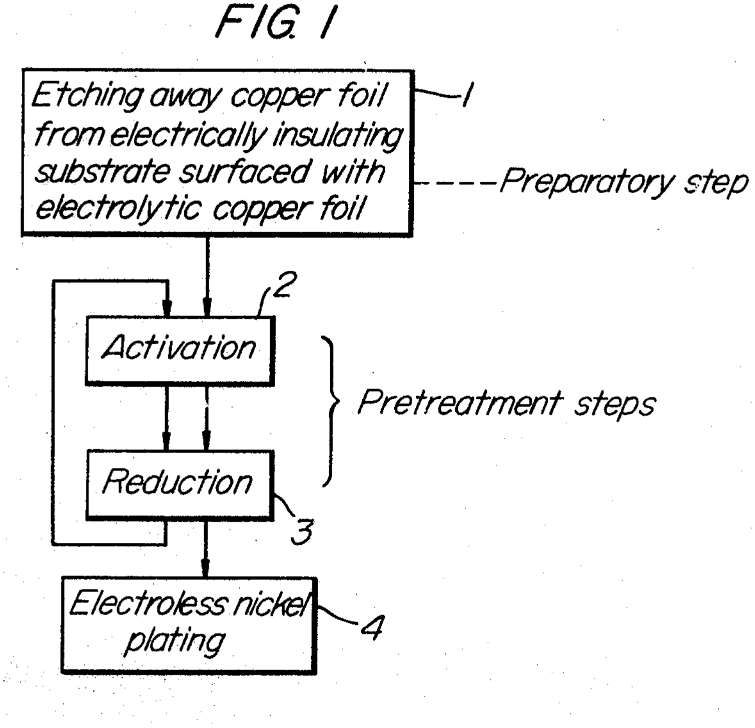
FIG. 1 is a block diagram showing the basic steps for manufacturing electrical parts according to the invention.

Referring now to FIG. 1, there is shown the basic steps for manufacturing electrical parts according to the invention. A block 1 therein represents a preparatory step in which a foil of electrolytic copper is chemically etched away from an electrically insulating substrate surfaced with the electrolytic copper foil in the manner as described above. The succeeding two blocks 2 and 3 represent steps of pretreatment. The former step is an activating treatment step in which the substrate, having been treated in the preparatory step, is immersed for about 1 minute in a first pretreatment solution and is then cleansed with pure water. This first pretreatment solution is an aqueous solution containing 447 milligrams per liter of palladium chloride and 3 cc. per liter of hydrochloric acid and is used by being heated to 60° C. The latter step is a reduction treatment step in which the substrate having been treated in the activating step is immersed for about 1 minute in a second pretreatment solution.

This second pretreatment solution is an aqueous solution containing 50 grams per liter of sodium hypophosphite and is used by being heated to 55° C. In the reduction treatment step, the ionized palladium depositing on the surface of the substrate is reduced to metallic palladium. After the above reduction treatment step, the substrate is thoroughly washed with water. The activating treatment and the reduction treatment described above may be alternately repeated if required. At the completion of the above pretreatment steps, metallic palladium is seen as deposited in the form of nucleic on the surface of the substrate.

The above steps are followed by a step of electroless nickel plating which is represented by a block 4 in FIG. 1. In this nickel plating step, an electroless plating solution as described below may be used. That is, 77.5 grams of nickel sulfate, 8.8 grams of sodium hypophosphite, 129.0 grams of sodium citrate, 77.0 grams of ammonium acetate and 10.6 grams of ammonium chloride are dissolved in 1 liter of pure water, and 4 N ammonia water is added thereto to adjust the pH value at 9. This plating solution is heated to 70° C. and the substrate having been subjected to the pretreatment is immersed in this plating solution for a predetermined time depending on the desired resistance values. In this plating treatment, the metallic palladium deposited in the form of nucleic on the substrate surface by the pretreatment serves as a catalyzer to cause deposition mainly of metallic nickel. The metallic nickel once deposited in this manner now acts as a catalyzer to cause successive deposition of metallic nickel.

Figure 2:
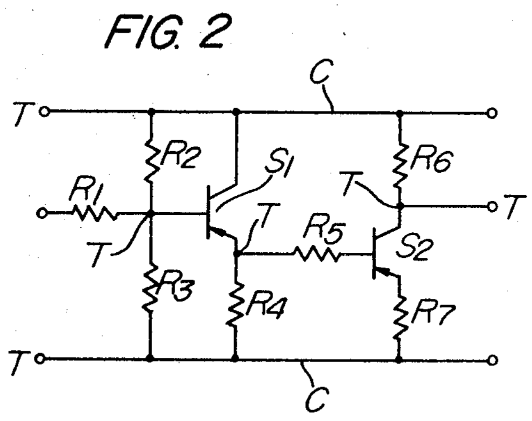
FIG. 2 is an electrical wiring diagram for the purpose of explaining the method for making wiring boards according to the invention.
Figure 3:
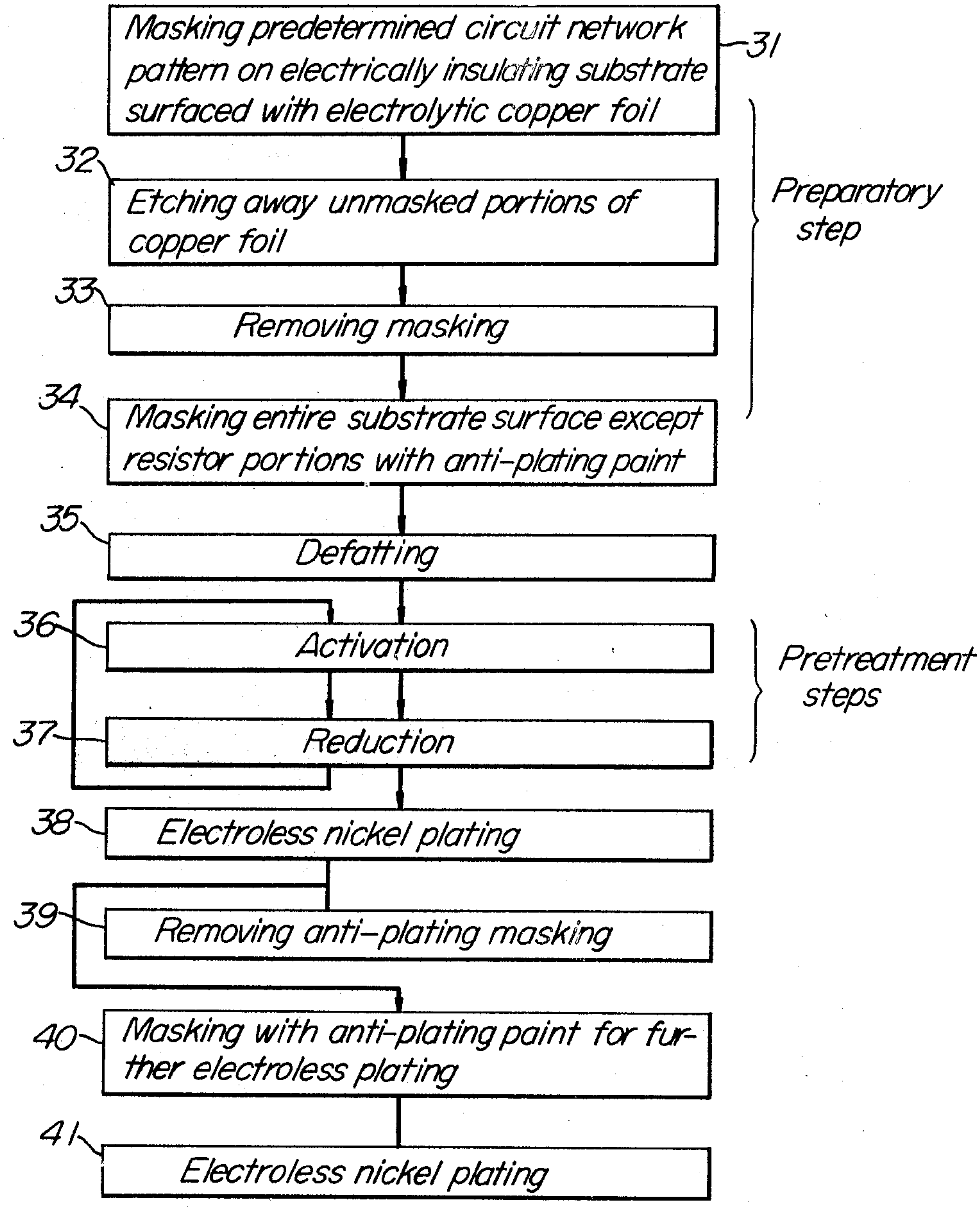
FIG. 3 is a block diagram showing the successive steps for manufacturing a wiring board having a circuit network as shown in FIG. 2 according to the method of the invention.

The method for making electric parts according to the invention described with reference to FIG. 1 is further advanced to provide a method for making a wiring board having resistors deposited on the board surface in unitary relation therewith. FIG. 3 shows manufacturing steps of such wiring board and FIG. 2 is a wiring diagram of a circuit to be made by the steps of FIG. 3. A simple transistor amplifier circuit is shown in FIG. 2 by way of example, in which $S_1$ and $S_2$ denote transistors and $R_1$, $R_2$, $R_3$, $R_4$, $R_5$, $R_6$ and $R_7$ denote resistors.

Figure 4:
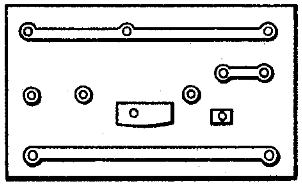
FIGS. 4, 5 and 6 are plan views showing the manner in which the wiring board is manufactured by the steps of FIG. 3.

As in the previous embodiment, the present embodiment also starts from a copper-surfaced electrically insulating substrate for use in the so-called printed circuit which is obtained by causing a foil of electrolytic copper to adhere under heat and pressure to an electrically insulating base plate impregnated with a thermosetting resin. In FIG. 3, a block 31 represents a step of masking a predetermined circuit network on the electrically insulating substrate surfaced with electrolytic copper foil. In this step, copper foil portions corresponding to conductor portions C and terminal portions T of the desired circuit, as shown in FIG. 2, are masked with an etching resist material (Ex NAZ–DAR211 of NAZ–DAR Company, Chicago 10, Ill.). This masking step is followed by a step represented by a block 32 in which the unmasked portions of the copper foil are etched away according to common practice. This etching step is then followed by a step of removing the etching resist material, as indicated by a block 33, to obtain a desired conductive pattern left on the substrate, as shown in FIG. 4.

Figure 5:
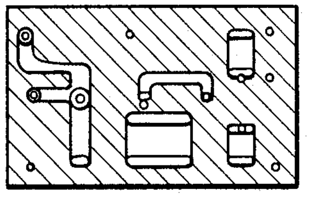

The succeeding step is represented by a block 34. In this step, the entire substrate surface, except seven resistor portions illustrated in FIG. 2, is masked with a plating resist paint. The substrate thus treated is shown in FIG. 5. This masking treatment may desirably be followed by a defatting treatment step represented by a block 35. The plating resist paint referred to above may have the following composition:

| | | Percent |
|---|---|---|
| Copolymer of vinyl chloride and vinyl acetate | | 34.9 |
| Pigment | | 20 |
| Solvent: | | |
| | Ethyl acetate | 45.1 |
| | Toluene | |
| | Diisobutyl ketone | |
| | Xylene | |

Figure 6:
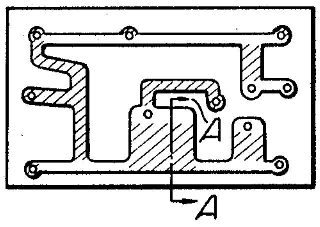

This defatting treatment step is then followed by pretreatment steps including an activating treatment and a reduction treatment such as are described in detail in the previous embodiment. These steps are represented by blocks 36 and 37 but it will be unnecessary to give any detailed description as to these steps. Since the succeeding step of electroless nickel plating is similar to the one described in the previous embodiment, this step is merely represented by a block 38. A step of removing the plating resist masking represented by a block 39 is taken after the step of nickel plating to obtain a finished product as shown in FIG. 6. It will, however, be understood that the activating treatment step represented by the block 36 may desirably be again taken after the step of reduction treatment represented by the block 37, as in the case of the embodiment shown in FIG. 1.

Figure 7:
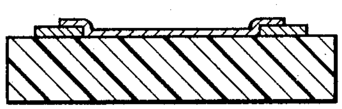
FIG. 7 is a sectional view taken on the line A—A in FIG. 6.
Figure 8:
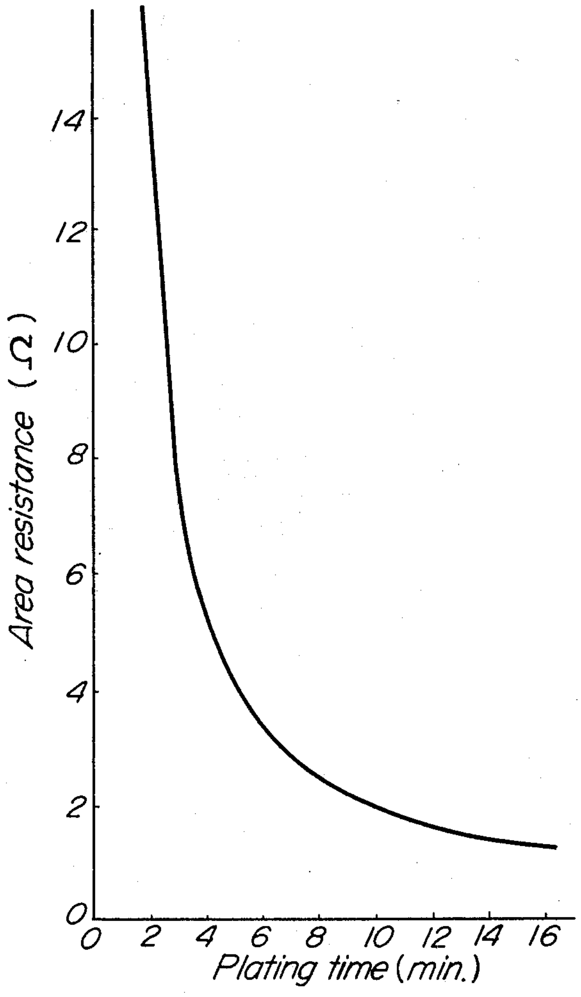
FIG. 8 is a graphic illustration of the relation between the time of electroless plating in minutes and area resistance in ohms of resistors formed on a substrate by the method according to the invention.

An enlarged section of part of the finished wiring board of FIG. 6 is shown in FIG. 7, in which it will be seen that a nickel resistor is deposited in unitary relation with the substrate and spans between opposite conductors on the substrate. The resistance value of resistors that can be obtained in this manner can freely be selected depending on the shape of a desired resistor pattern, but this value can also be greatly varied by the time of electroless plating, as will be easily understood from the graph of FIG. 8 as well as the foregoing description with regard to the manufacturing steps.

The manner of resistance variation will briefly be described below. Suppose now it is desired to make the resistance value of one of the seven resistors, say the resistor $R_4$, smaller than those of the remaining resistors. In such a case, the step of electroless plating represented by the block 38 is not directly followed by a step of removing the plating resist masking represented by a block 39, but the entire resistor portions except the specific resistor portion $R_4$ on the substrate are masked with the same plating resist paint as used in the step of masking represented by the block 34. This second masking step is represented by a block 40, which is then followed by a step of electroless nickel plating represented by a block 41. A step of removing all the plating resist masking may finally be taken, but it may also be preferable to cover the substrate surface with a moisture-resisting and rust-resisting paint with the masking left intact.

What is claimed is:

1. A method for making a printed circuit member comprising the steps of preparing a metal-laminated electrically insulated substrate by producing a foil of electrolytic metal having a roughened surface, adhering the roughened surface of the foil to a base plate of electrically insulating material in a manner and with a sufficient degree of pressure to impart the roughened surface characteristic of the foil to the base plate, etching away said metal foil from said electrically insulated substrate at at least one predetermined location to expose the roughened surface on said substrate at said predetermined location, and depositing by electroless plating at said predetermined location a given quantity of a conductive material for a predetermined time to provide a resistor on said substrate of a predetermined value.

2. A method according to claim 1 in which said base plate is impregnated with a thermo-setting resin and the metal foil is adhered to the base plate by applying heat as well as pressure thereto.

3. A method according to claim 1 wherein said conductive material includes nickel.

4. A method according to claim 1 wherein said material forming said resistor is deposited on the exposed roughened surface portion of the substrate to have portions thereof electrically connected to conductive portions of said foil.

5. A method according to claim 1 wherein a plurality of said predetermined locations are etched away to provide a like plurality of locations on which said conductive material is deposited by electroless plating to provide a corresponding plurality of resistors.

6. A method according to claim 5 wherein said resistors span and are electrically connected to conductive portions of foil remaining on the substrate.

7. A method according to claim 5 further comprising the step of depositing by electroless plating on selected ones of said predetermined locations additional material to lower the value of the resistors at said selected locations as compared to the resistors at the other locations.

8. A printed circuit member comprising a substrate of insulating material, a metal foil having a roughened near surface, means adhering said metal foil to said substrate with at least a portion of the roughened rear surface embedded in the substrate material, said metal foil having at least one portion hereof etched away to leave an exposed roughened surface on the substrate, and a predetermined quantity of a material having the property of electrical resistance electrolessly deposited on said exposed portion of said substrate and spanning and electrically connected to remaining portions of the metal foil to form a resistance element electrically connected on said circuit board.

9. A printed circuit member as in claim 8 wherein said material electrolessly deposited on the substrate includes nickel.

References Cited

UNITED STATES PATENTS

| | | | |
|---|---|---|---|
| 3,391,454 | 7/1968 | Reimann et al. | 29—625 |
| 3,319,317 | 5/1967 | Roche et al. | 204—15 X |
| 3,305,460 | 2/1967 | Lacy. | |
| 3,293,109 | 12/1966 | Luce et al. | |
| 3,282,723 | 11/1966 | Melillo. | |
| 2,849,298 | 8/1958 | Werberig. | |

ALFRED L. LEAVITT, Primary Examiner

A. GRIMALDI, Assistant Examiner

U.S. Cl. X.R.

29—626; 96—36.2; 117—8.5